United States Patent [19]

Futatsuka et al.

[11] Patent Number: 4,750,029

[45] Date of Patent: Jun. 7, 1988

[54] COPPER BASE LEAD MATERIAL FOR LEADS OF SEMICONDUCTOR DEVICES

[75] Inventors: Rensei Futatsuka, Aizuwakamatsu; Tadao Sakakibara, Yukawa; Shunichi Chiba, Aizuwakamatsu, all of Japan

[73] Assignee: Mitsubishi Shindoh Co., Ltd., Tokyo, Japan

[21] Appl. No.: 32,976

[22] Filed: Mar. 26, 1987

Related U.S. Application Data

[63] Continuation-in-part of Ser. No. 769,936, Aug. 27, 1985, abandoned.

[30] Foreign Application Priority Data

Aug. 31, 1984 [JP] Japan ................................ 59-183594

[51] Int. Cl.$^4$ ......................... H01L 23/50; C22C 9/02
[52] U.S. Cl. ....................................... 357/67; 357/70; 420/471; 420/472; 420/473
[58] Field of Search .............. 420/469, 470, 471, 472, 420/473, 489; 428/928; 357/67, 70

[56] References Cited

FOREIGN PATENT DOCUMENTS 3530736 3/1986 Fed. Rep. of Germany .
58-53057 11/1983 Japan ................................. 420/472
2123032 1/1984 United Kingdom ............... 420/472

*Primary Examiner*—L. Dewayne Rutledge
*Assistant Examiner*—George Wyszomierski
*Attorney, Agent, or Firm*—Frishauf, Holtz, Goodman & Woodward

[57] ABSTRACT

A copper base lead material for leads of a semiconductor device, which consists essentially of from 0.05 to 0.25 percent by weight tin, from 0.01 to 0.2 percent by weight silver, from 0.025 to 0.1 percent by weight phosphorus, from 0.05 to 0.2 percent by weight magnesium, and the balance of copper and inevitable impurities, wherein the P/Mg ratio is within a range from 0.5 to 0.85, preferably within a range from 0.60 to 0.85, so as to form a compound of magnesium and phosphorus or $Mg_3P_2$. The copper base lead material possesses satisfactory properties required of a metal material for leads in semiconductor devices, such as strength, thermal resistance, and stampability, and further possesses excellent heat radiation to an extent suitable for use as leads of semiconductor devices having high wiring densities. The invention also includes the semiconductor device containing said leads.

8 Claims, 3 Drawing Sheets

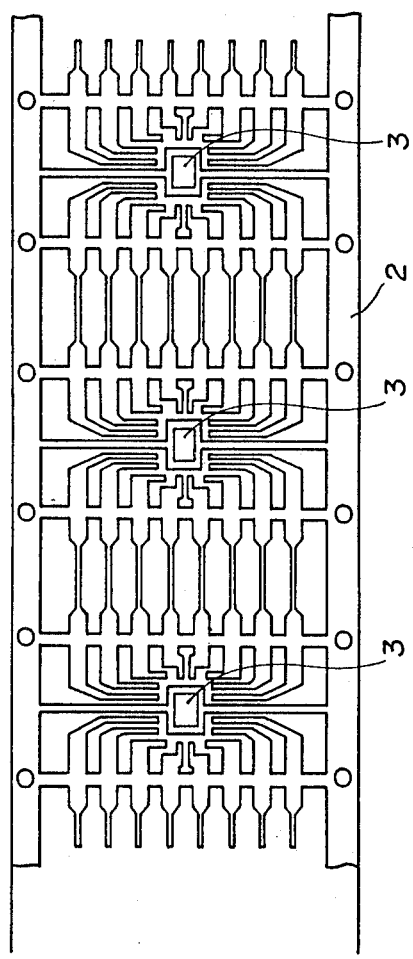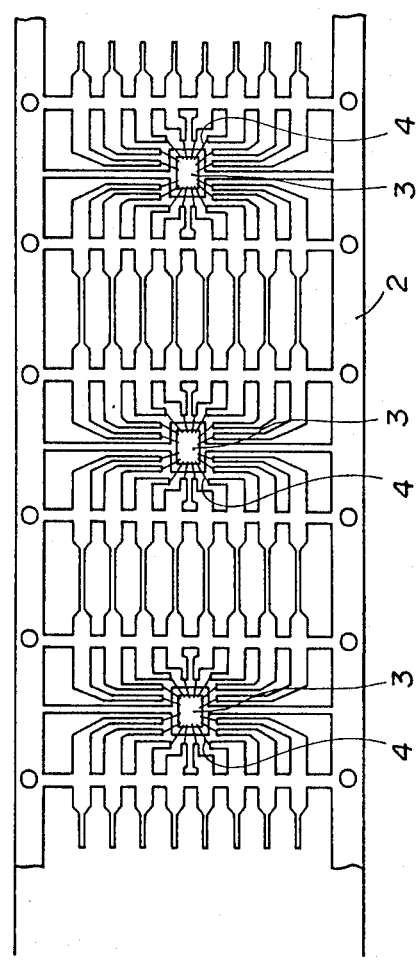

though thin, and therefore can be practically used as leads of semiconductor devices having high wiring densities.

COPPER BASE LEAD MATERIAL FOR LEADS OF SEMICONDUCTOR DEVICES

This application is a continuation-in-part of application Ser. No. 769,936, filed Aug. 27, 1985, now abandoned.

BACKGROUND OF THE INVENTION

This invention relates to a copper base lead material for leads in semiconductor devices, and more particularly to such lead material which possesses sufficient strength which is particularly required of a metal material for leads in semiconductor devices having high wiring densities, while also exhibiting excellent heat radiation or thermal conductivity.

A semiconductor device such as an integrated circuit (hereinafter called "IC") is generally manufactured, for instance, by the following main processes (a)-(f):

(a) preparing a strip for leads having a thickness within a range from 0.1 to 0.3 mm as a metal material for leads;

(b) stamping the strip for leads into a lead frame having a shape suitable for that of the semiconductor device which is to be manufactured;

(c) mounting IC chips on the lead frame at its predetermined surface portions, either by hot bonding using a conductive resin such as Ag paste, or by thermocompression bonding through one or more plating layers of at least one selected from the group consisting of Au, Ag, and Ni which has been previously plated on the surface of the strip or the lead frame;

(d) connecting elements of the IC chips to the lead frame by wire bonding using Au wires or the like;

(e) encapsulating the IC chips, the wire bonding portions, the surface portions of the lead frame on which the IC chips have been mounted, etc. by a plastic resin or the like for protection of same; and (f) cutting the lead frame along boundaries between adjacent ones of the IC chip-mounted surface portions, to form leads of the semiconductor device.

Therefore, a metal material for leads of a semiconductor device is required to satisfy properties such as excellent stampability, thermal resistance enough to be free of thermal strain as well as thermal softening when IC chips are bonded to a lead frame stamped from the material for leads, excellent heat radiation, i.e. thermal conductivity (since the thermal conductivity is proportional to the electrical conductivity, the heat radiation can be measured in terms of electrical conductivity), and particularly sufficient strength enough to be free of breakage during transportation of the semiconductor device or when the leads are repeatedly bent in connecting them to wiring boards during mounting of the semiconductor device into an electrical device or an electronic device. That is, a metal material for leads of a semiconductor device such as a plastic leaded chip carrier (PLCC) type IC device is required to possess the following satisfactory properties:

Tensile Strength (for evaluation of the strength): not less than 50 Kg/mm²;
Elongation: not less than 5%;
Electrical Conductivity (for evaluation of the heat radiation and electrical conductivity): not less than 80% I.A.C.S. (International Annealed Copper Standard); and
Softening Point (for evaluation of the thermal resistance): not less than 350° C.

There has been a recent demand for a lead material having a reduced thickness so as to meet a recent demand for more lightweight and higher performance semiconductor devices. Conventionally, copper base alloys of high strength and relatively high electrical conductivity have been proposed, e.g., by British Pat. No. 2,123,032A, which comprises 0.05 to 0.2% tin, 0.05 to 0.25% magnesium, optionally up to 0.4% silver, optionally up to 0.01% phosphorus, and the balance of copper and impurities. However, the alloys of the British patent do not possess strength sufficient to fulfill the recent requirements, particularly reduced thickness.

SUMMARY OF THE INVENTION

It is the object of the invention to provide a copper base lead material for leads in semiconductor devices, which exhibits satisfactory properties such as heat radiation, thermal resistance, and stampability, and further possesses sufficient strength when it is used as leads in semiconductor devices having high wiring densities.

According to the invention, there is provided a copper base lead material for leads of semiconductor devices, which consists essentially of:

Tin: from 0.05 to 0.25 percent by weight;
Silver: from 0.01 to 0.2 percent by weight;
Phosphorus: from 0.25 to 0.1 percent by weight;
Magnesium: from 0.05 to 0.2 percent by weight; and
Copper and inevitable impurities: the balance, wherein the ratio of phosphorus to magnesium (P/Mg) is within a range from 0.5 to 0.85, preferably 0.60 to 0.85; so as to form a compound of magnesium and phosphorus ($Mg_3P_2$).

BRIEF DESCRIPTION OF THE DRAWINGS

FIGS. 1–7 are plan views respectively illustrating processes of adapting a copper base alloy lead material according to the invention as leads of a semiconductor device.

DETAILED DESCRIPTION

Figure 1:
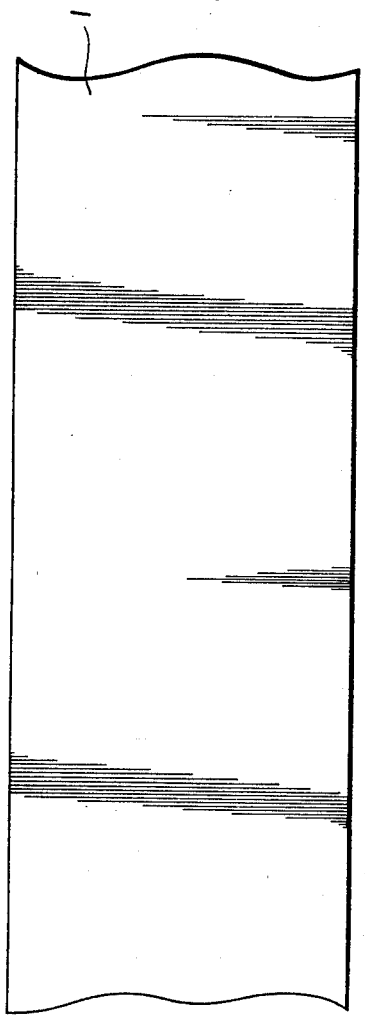

Under the aforementioned circumstances, the present applicants have made studies in order to obtain a copper base lead material for leads in semiconductor devices which possesses satisfactory properties required of a metal material for leads in semiconductor devices, and further exhibits sufficient strength, i.e. possesses sufficient tensile strength not less than 50 kg/mm², and excellent elongation not less than 6%, when it is used as leads in semiconductor devices having high wiring densities, and have reached the following finding:

A copper base alloy consisting essentially of:
Tin: from 0.05 to 0.25 percent by weight;
Silver: from 0.01 to 0.2 percent by weight;
Phosphorus: from 0.025 to 0.1 percent by weight;
Magnesium: from 0.05 to 0.2 percent by weight; and
Copper and inevitable impurities: the balance, wherein the ratio of phosphorus to magnesium (P/Mg) is within a range from 0.5 to 0.85, preferably 0.60 to 0.85, so as to form a compound of magnesium and phosphorus ($Mg_3P_2$). satisfies the following property requirements:

Tensile Strength: not less than 50 Kg/mm²;
Elongation: not less than 6%;
Electrical Conductivity: not less than 80%; and
Softening Point: not less than 405° C., and thereby can be practically used as leads of semiconductor devices having high wiring densities.

The present invention is based upon the above finding. The contents of the component elements of the copper base lead material for leads of semiconductor devices according to the present invention have been limited as previously stated, for the following reasons:

(a) Tin and Silver:

These ingredients not only act to enhance the strength of the material for leads, but also improve the thermal resistance and stampability of the material for leads. However, if the tin content is less than 0.05% by weight, or if the silver content is less than 0.01% by weight, the above action cannot be performed to a desired extent. On the other hand, if the tin content exceeds 0.25% by weight, there can occur a degradation in the electrical conductivity of the leads, thus failing to obtain a desired degree of heat radiation, while if the silver content exceeds 0.2% by weight, there will be no further improvement obtained. Therefore, the tin content and the silver content have been limited within a range from 0.05 to 0.25% by weight, and a range from 0.01 to 0.2% by weight, respectively.

(b) Phosphorus and Magnesium:

The phosphorus and magnesium form a compound $Mg_3P_2$ which acts to improve the strength of the material for leads. If the magnesium content is slightly larger than the phosphorus content, this compound $Mg_3P_2$ can be positively formed, with a negligible amount of Mg in solid solution, thus having almost no adverse influence upon the properties of the leads. However, considerably excessive magnesium in the material impairs the electrical conductivity of the leads. Therefore, the content ratio P/Mg has been limited within a range from 0.5 to 0.85, preferably 0.60 to 0.85.

These ingredients thus coact to increase the strength of the leads without impairing the electrical conductivity. Also, they act as deoxidizers. However, if the phosphorus content is less than 0.025% by weight and at the same time the magnesium content is less than 0.05% by weight, the above action cannot be performed to a desired extent. On the other hand, if the phosphorus content exceeds 0.1% by weight and at the same time the magnesium content exceeds 0.2%, the lead material can have degraded electrical conductivity as the leads. Therefore, the phosphorus content and the magnesium content have been limited within a range from 0.025 to 0.1% by weight, and a range from 0.05 to 0.2% by weight, respectively.

Incidentally, in the manufacture of the copper base lead material for leads according to the present invention, a deoxidizer composed of at least one selected from the group consisting of Al, Mn, Ca, and B may be added to the molten metal. If these deoxidizer elements are each added in not more than 0.01% by weight, the properties of the leads cannot be badly affected by the deoxidizer.

The manner of adapting the copper base alloy lead material according to the present invention as leads of a semiconductor device will be explained, with reference to the accompanying drawings.

Figure 2:
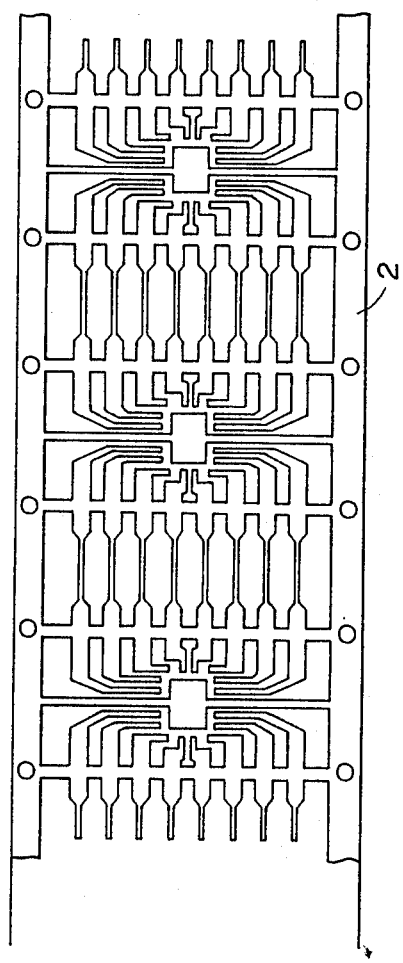
Figure 5:
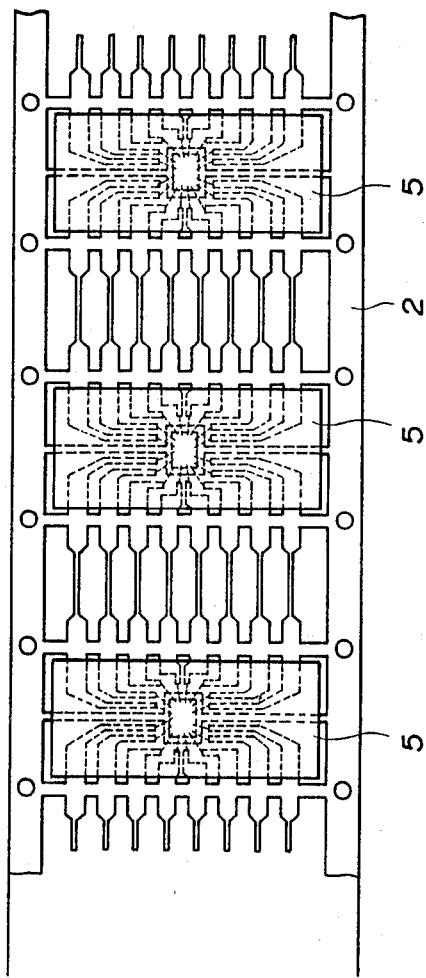
Figure 7:
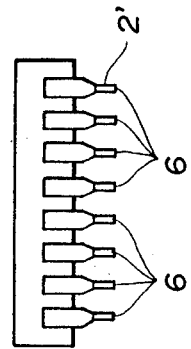
Figure 6:
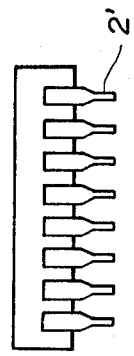

First, as shown in FIG. 1, a copper base alloy lead strip 1 having a thickness within a range from 0.1 to 0.3 mm is prepared from a molten copper base alloy having a predetermined chemical composition according to the present invention, as a material for leads of a semiconductor device. Preferably, a major surface of the lead strip 1 may be plated with one or more plating layers of, e.g., at least one metal selected from the group consisting of Au, Ag, and Ni. Then, the lead strip 1 is stamped into a lead frame 2 having a shape suitable for use in the semiconductor device which is to be manufactured (FIG. 2). Semiconductor chips 3, in which are incorporated elements including semiconductor elements of high purity Si, Ga-As alloy, or the like, are mounted onto the lead frame 2 at its predetermined surface portions (FIG. 3), by hot bonding at a temperature within a range from 200°–350° C. using a conductive resin such as Ag paste. The semiconductor chips 3 may preferably be mounted on the lead frame 2 at its predetermined surface portions by thermocompression bonding at a temperature within a range from 200°–400° C. through the one or more plating layers. Then, elements of the semiconductor chips 3 are connected to the lead frame 2 by wire bonding using Au wires 4 (FIG. 4). The semiconductor chips 3, the wire bonding portions, the surface portions of the lead frame 2, on which the semiconductor chips 3 have been mounted, etc. are encapsulated by a plastic resin 5 for protection of same (FIG. 5). Then the lead frame 2 is cut along boundaries between adjacent ones of the semiconductor chip-mounted surface portions, to form leads 2' of the semiconductor device (FIG. 6). Finally, the whole or part of the surfaces of the leads 2' is plated with a solder 6 of an Sn-Pb alloy by dipping, to solder the leads 2' to the substrate of the semiconductor device (FIG. 7).

The present invention will be more cleary understood by referring to the following example.

EXAMPLE

Copper base alloys having chemical compositions as shown in Table 1 were melted in an ordinary low-frequency channel type induction furnace into molten metals, followed by casting the molten metals according to a conventional semicontinuous casting method into copper base alloy cakes each having a size of 150 mm in thickness, 400 mm in width, and 1500 mm in length. The cakes were hot rolled at an initial hot rolling temperature of 800° C. into hot rolled plates each having a thickness of 11 mm. After being quenched, the hot rolled plates each had its both sides scalped into a thickness of 10 mm, followed by repeatedly alternately subjecting them to cold rolling and aging treatment, and then, they were subjected to final cold rolling at a reduction ratio of 75%, into lead strips each having a thickness of 0.25 mm. Then, the lead strips were annealed to relieve internal stresses at a temperature within a range from 250° to 350° C. and for a holding time of 15 minutes, to obtain copper base lead strips Nos. 1–10 according to the present invention, as the copper base lead materials for leads according to the present invention and comparative copper base 1–6 as comparative copper base lead materials for leads, as shown in Table 1.

TABLE 1

| SPECIMEN | No. | CHEMICAL COMPOSITION (WEIGHT %) | | | | | CONTENT RATIO P/Mg | TENSILE STRENGTH (Kg/mm$^2$) | ELONGATION (%) | ELECTRICAL CONDUCTIVITY (% IACS) | SOFTENING POINT (°C.) |
|---|---|---|---|---|---|---|---|---|---|---|---|
| | | Sn | Ag | P | Mg | Cu | | | | | |
| COPPER BASE | 1 | 0.052 | 0.091 | 0.062 | 0.092 | bal. | 0.67 | 50.8 | 6 | 88 | 405 |

TABLE 1-continued

| SPECIMEN | No. | CHEMICAL COMPOSITION (WEIGHT %) | | | | | CONTENT RATIO P/Mg | TENSILE STRENGTH (Kg/mm$^2$) | ELONGATION (%) | ELECTRICAL CONDUCTIVITY (% IACS) | SOFTENING POINT (°C.) |
|---|---|---|---|---|---|---|---|---|---|---|---|
| | | Sn | Ag | P | Mg | Cu | | | | | |
| LEAD STRIPS | 2 | 0.15 | 0.089 | 0.060 | 0.089 | bal. | 0.67 | 52.9 | 6 | 85 | 410 |
| ACCORDING TO | 3 | 0.24 | 0.092 | 0.062 | 0.088 | bal. | 0.70 | 54.5 | 7 | 82 | 415 |
| THE PRESENT | 4 | 0.15 | 0.021 | 0.059 | 0.090 | bal. | 0.66 | 51.2 | 6 | 85 | 410 |
| INVENTION | 5 | 0.14 | 0.19 | 0.061 | 0.089 | bal. | 0.69 | 53.4 | 7 | 83 | 415 |
| | 6 | 0.15 | 0.091 | 0.044 | 0.052 | bal. | 0.85 | 51.8 | 6 | 86 | 410 |
| | 7 | 0.15 | 0.089 | 0.046 | 0.090 | bal. | 0.51 | 52.3 | 6 | 85 | 410 |
| | 8 | 0.24 | 0.092 | 0.026 | 0.051 | bal. | 0.51 | 53.7 | 7 | 83 | 415 |
| | 9 | 0.25 | 0.091 | 0.097 | 0.195 | bal. | 0.50 | 55.6 | 7 | 81 | 420 |
| | 10 | 0.24 | 0.19 | 0.098 | 0.189 | bal. | 0.52 | 56.3 | 7 | 80 | 425 |
| COMPARATIVE | 1 | 0.038* | 0.089 | 0.061 | 0.089 | bal. | 0.69 | 49.2 | 5 | 90 | 400 |
| COPPER BASE | 2 | 0.14 | 0.006* | 0.059 | 0.087 | bal. | 0.68 | 49.6 | 6 | 86 | 400 |
| LEAD STRIPS | 3 | 0.14 | 0.092 | 0.007* | 0.090 | bal. | 0.08 | 48.1 | 5 | 79 | 410 |
| | 4 | 0.15 | 0.091 | 0.127* | 0.090 | bal. | 1.41 | 53.4 | 6 | 73 | 415 |
| | 5 | 0.16 | 0.090 | 0.060 | 0.045* | bal. | 1.33 | 49.5 | 6 | 80 | 410 |
| | 6 | 0.15 | 0.092 | 0.062 | 0.236* | bal. | 0.26 | 54.0 | 5 | 77 | 415 |

Values marked with an asterisk are outside the range of the present invention.

Then, the copper base lead strips Nos. 1–10 according to the present invention, as well as the comparative copper base lead strips Nos. 1–6 were tested with respect to tensile strength, elongation, electrical conductivity, and softening point. The test results are shown in Table 1.

From the test results shown in Table 1, it is noted that each one of the copper base lead strips Nos. 1–10 according to the present invention satisfy the following property requirements:

Tensile Strength: not less than 50 Kg/mm$^2$;
Elongation: not less than 6%;
Electrical Conductivity: not less than 80%; and
Softening Point: not less than 405° C.

On the other hand, the test results also indicate that if any one of the component elements is out of the range specified by the present invention, like the comparative copper base lead strips Nos. 1–6, the resulting lead strip is inferior in at least one of the above-mentioned properties to the copper base lead strips Nos. 1–10 according to the present invention.

Therefore, the copper base lead material of the present invention will exhibit excellent properties when they are used as leads in semiconductor devices, particularly, as those in semiconductor devices having high wiring densities.

Further, the copper base lead strips Nos. 1–10 according to the present invention were tested with respect to properties further required of a metal material for leads in semiconductor devices, such as stampability, etchability, platability, weldability, and as a result, showed these properties to satisfactory extent. Therefore, the copper base lead material for leads of semiconductor devices according to the present invention will exhibit excellent qualities when it is used as a material not only for leads in ordinary semiconductor devices, but also for those in semiconductor devices having high wiring densities, and it can also be used as materials for terminals and connectors of electrical and electronic devices and apparatus.

What is claimed is:

1. A copper base lead material for leads of a semiconductor device, which consists essentially of from 0.05 to 0.25 percent by weight tin, from 0.01 to 0.2 percent by weight silver, from 0.025 to 0.1 percent by weight phosphorus, from 0.05 to 0.2 percent by weight magnesium, and the balance of copper and inevitable impurities, wherein the P/Mg ratio is from 0.5 to 0.85.

2. The copper base lead material of claim 1, further containing at least one element selected from the group consisting of aluminum, manganese, calcium, and boron, to act as at least one deoxidizer, said at least one element being each contained in an amount not more than 0.01 percent by weight.

3. The copper base lead material for leads of a semiconductor device of claim 9, wherein the P/Mg ratio is from 0.6 to 0.85.

4. The copper base lead material of claim 3, further containing at least one element selected from the group consisting of aluminum, manganese, calcium, and boron, to act as at least one deoxidizer, said at least one element being each contained in an amount not more than 0.01 percent by weight.

5. A semiconductor device having leads, said leads comprising a copper base lead material which consists essentially of from 0.05 to 0.25 percent by weight tin, from 0.01 to 0.2 percent by weight silver, from 0.025 to 0.1 percent by weight phosphorus, from 0.05 to 0.2 percent by weight magnesium, and the balance of copper and inevitable impurities, wherein the P/Mg ratio is from 0.5 to 0.85.

6. The semiconductor device of claim 5, wherein said copper base lead material also contains at least one element selected from the group consisting of aluminum, manganese, calcium, and boron, to act as at least one deoxidizer, said at least one element being each contained in an amount not more than 0.01 percent by weight.

7. The semiconductor device of claim 5, wherein in said copper base lead material, the P/Mg ratio is from 0.6 to 0.85.

8. The semiconductor device of claim 7, wherein said copper base lead material also contains at least one element selected from the group consisting of aluminum, manganese, calcium, and boron, to act as at least one deoxidizer, said at least one element being each contained in an amount not more than 0.01 percent by weight.

* * * * *